United States Patent [19]

Jiang

[11] Patent Number: 5,714,785
[45] Date of Patent: Feb. 3, 1998

[54] ASYMMETRIC DRAIN/SOURCE LAYOUT FOR ROBUST ELECTROSTATIC DISCHARGE PROTECTION

[75] Inventor: Chun Jiang, San Jose, Calif.

[73] Assignee: VLSI Technology, Inc., San Jose, Calif.

[21] Appl. No.: 586,042

[22] Filed: Jan. 16, 1996

[51] Int. Cl.$^6$ .................................................. H01L 23/62
[52] U.S. Cl. ................................ 257/360; 257/361
[58] Field of Search ........................... 257/360, 361, 257/355

[56] References Cited

U.S. PATENT DOCUMENTS

| | | | |
|---|---|---|---|
| 4,509,067 | 4/1985 | Minami et al. | 257/360 |
| 4,691,217 | 9/1987 | Ueno et al. | 257/360 |
| 4,937,471 | 6/1990 | Park et al. | 326/103 |

OTHER PUBLICATIONS

T. Polgreen, et al., *Improving the ESD Failure Threshold of Silicided nMOS Output Transistors by Ensuring Uniform Current Flow*, Proceedings. of EOS/ESD Symp., 1989, pp. 167–174.

C.H. Diaz, et al. *Building–in ESD/EOS Reliability for Sub-halfmicron CMOS Processes*, IRPS, 1995, pp. 276–283.

A. Amerasekera, et al, *Characterization and Modeling of Second Breakdown in NMOST's for the Extraction of ESD–Related Process and Design Paramenters*, IEEE Tran. Ele. Dev. vol. ED–38, pp. 2161–2168, Sep. 1991.

Primary Examiner—Sara W. Crane
Attorney, Agent, or Firm—Douglas L. Weller

[57] ABSTRACT

A structure is used for electrostatic discharge protection of an integrated circuit. The modified ladder structure includes drain regions which extend from an output pad. These are interleaved with source regions. For example, for a structure with two drain regions and two source regions, a first drain region extending from the output pad is separated from a first source region by a first gate region. A second drain region extending from the output pad is separated from the first drain region by a first insulating region. A second source region is separated from the second drain region by a second gate structure. For a structure with four drain regions and three source regions, there is additionally, a third drain region extending from the output pad. The third drain region is separated from the second source region by a third gate region. A fourth drain region extending from the output pad is separated from the third drain region by a second insulating region. A third source region is separated from the fourth drain region by a fourth gate region.

16 Claims, 3 Drawing Sheets

ASYMMETRIC DRAIN/SOURCE LAYOUT FOR ROBUST ELECTROSTATIC DISCHARGE PROTECTION

BACKGROUND

This invention relates generally to electro-static discharge effect on input/output circuits and particularly to protection of output circuits of semiconductor devices from damage resulting from electrostatic discharge.

Electrostatic discharge (ESD) can be a source of destruction for semiconductor devices. Various output protection circuits may be used to protect the output circuits from electrostatic discharge damage. For example, a ladder type structure is widely used in conventional NMOSFET output circuits. Generally the ladder structure is symmetric so that uniform current flow can be guaranteed along all polysilicon fingers during ESD spikes. However, there are several drawbacks with currently used symmetric ladder structures.

For example, generally, only half the polysilicon fingers are turned on during a transmission line pulse zapping. Further, since the current passing through the middle source region is twice the current passing through the side source regions, the effective source resistance (including the metal and contacts) in the middle region is twice the effective source resistance of the side source regions. The high source resistance can have a deleterious effect on ESD reliability.

SUMMARY OF THE INVENTION

In accordance with the preferred embodiment of the present invention, a structure is presented which is used for electrostatic discharge protection of an integrated circuit. The modified ladder structure includes drain regions which extend from an output pad. These are interleaved with source regions. For example, for a structure with two drain regions and two source regions, a first drain region extending from the output pad is separated from a first source region by a first gate region. A second drain region extending from the output pad is separated from the first drain region by a first insulating region. A second source region is separated from the second drain region by a second gate structure.

For a structure with four drain regions and three source regions, there is additionally, a third drain region extending from the output pad. The third drain region is separated from the second source region by a third gate region. A fourth drain region extending from the output pad is separated from the third drain region by a second insulating region. A third source region is separated from the fourth drain region by a fourth gate region.

In the preferred embodiment, rows of contacts are placed in the source regions and the drain regions. The rows of contacts are placed parallel to the gate regions. In the preferred embodiments, rows of contracts in the source regions are placed closer to the gate regions than rows of contracts in the drain regions. For example, for a structure with four drain regions and three source regions, a first row of contacts is placed in the first source region. The first row of contacts runs parallel to the first gate region. A second row of contacts is placed in the first drain region. The second row of contacts runs parallel to the first gate region. A third row of contacts is placed in the second drain region. The third row of contacts runs parallel to the second gate region. A fourth row of contacts is placed in the second source region. The fourth row of contacts runs parallel to the second gate region. A fifth row of contacts is placed in the second source region. The fifth row of contacts runs parallel to the third gate region. A sixth row of contacts is placed in the third drain region. The sixth row of contacts runs parallel to the third gate region. A seventh row of contacts is placed in the fourth drain region. The seventh row of contacts runs parallel to the fourth gate region. An eighth row of contacts is placed in the third source region. The eighth row of contacts runs parallel to the fourth gate region. The first row of contacts is closer to the first gate region than the second row of contacts. The fourth row of contacts is closer to the second gate region than the third row of contacts. The fifth row of contacts is closer to the third gate region than the sixth row of contacts. The eighth row of contacts is closer to the fourth gate region than the seventh row of contacts.

The present invention allows for a structure in which the gate regions are all turned on uniformly during a transmission line pulse zapping. This uniformity is produced by the use of a separate drain configuration. In addition, in the preferred embodiment of the present invention the number of contacts is doubled for the middle source region. This provides for a uniform and low source resistance.

DESCRIPTION OF THE PRIOR ART

Figure 1:
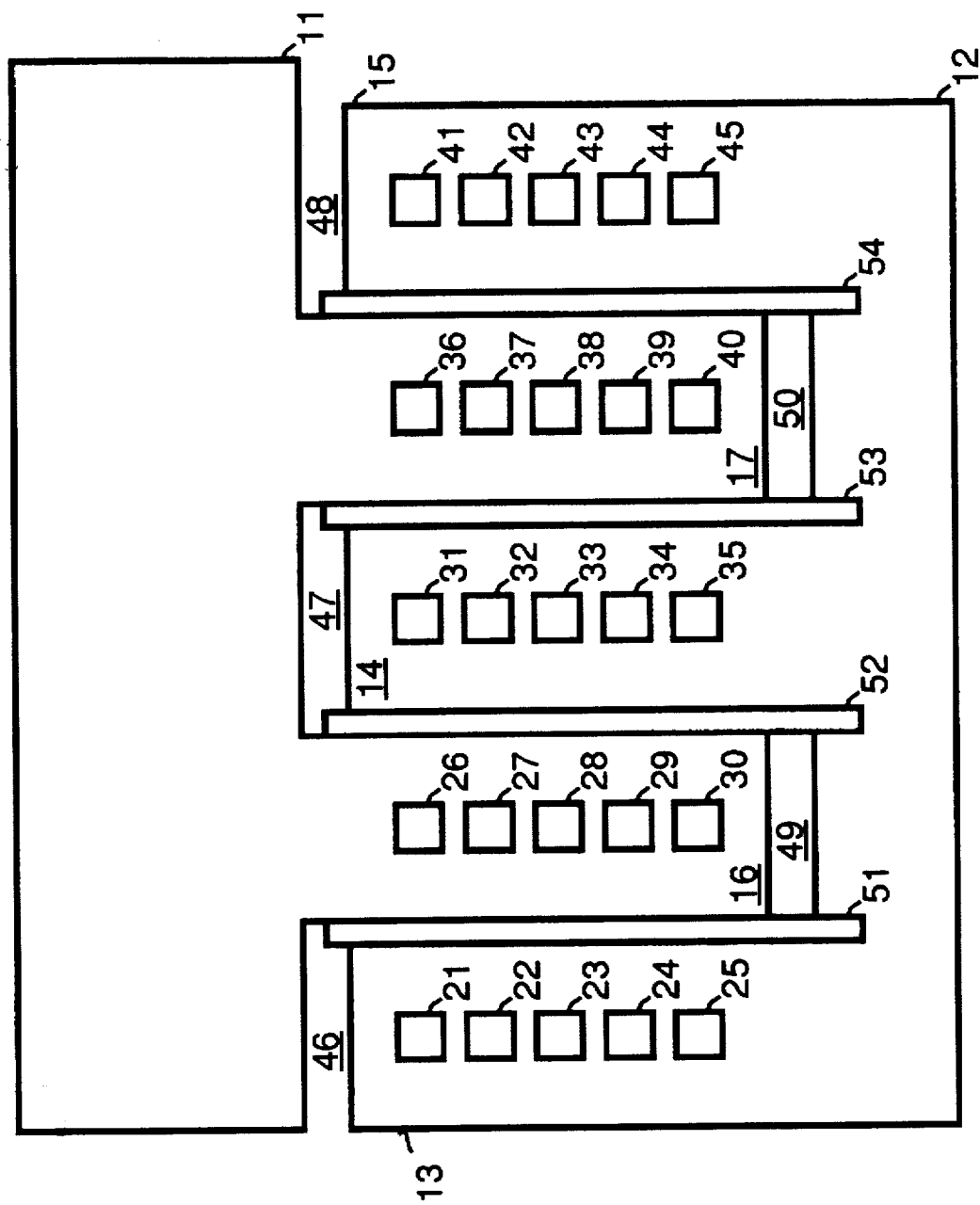
FIG. 1 is a top view of a symmetric ladder structure ESD circuit in accordance with the prior art.

FIG. 1 is a top view of a symmetric ladder structure ESD circuit in accordance with the prior art. An output pad 11 is electrically connected to a drain region 16 and a drain region 17. A source 12 includes a source region 13, a source region 14 and a source region 15. A gate region 51, a gate region 52, a gate region 53 and a gate region 54 separate source regions 13, 14 and 15 from drain regions 16 and 17. The circuit also includes an insulating region 46, an insulating region 47, an insulating region 48, an insulating region 49 and an insulating region 50. Source regions 13, 14 and 15 and drain regions 16 and 17 are connected to a metal layer through a contact 21, a contact 22, a contact 23, a contact 24, a contact 25, a contact 26, a contact 28, a contact 29, a contact 30, a contact 31, a contact 32, a contact 33, a contact 34, a contact 35, a contact 36, a contact 38, a contact 39, a contact 40, a contact 41, a contact 42, a contact 43, a contact 44 and a contact 45.

The ladder structure shown in FIG. 1 is symmetric so that uniform current flow can be guaranteed along all of gate regions 51, 52, 53 and 54 during ESD spikes. However, only half of gate regions 51, 52, 53 and 54 are turned on during a transmission line pulse zapping. Further, since the current passing through the source region 14 is twice the current passing through source region 13 and source region 15, the effective source resistance (including the metal and contacts) in the source region 14 is twice the effective source resistance of source region 13 and source region 15. The high source resistance can have a deleterious effect on ESD reliability.

DESCRIPTION OF THE PREFERRED EMBODIMENT

Figure 2:
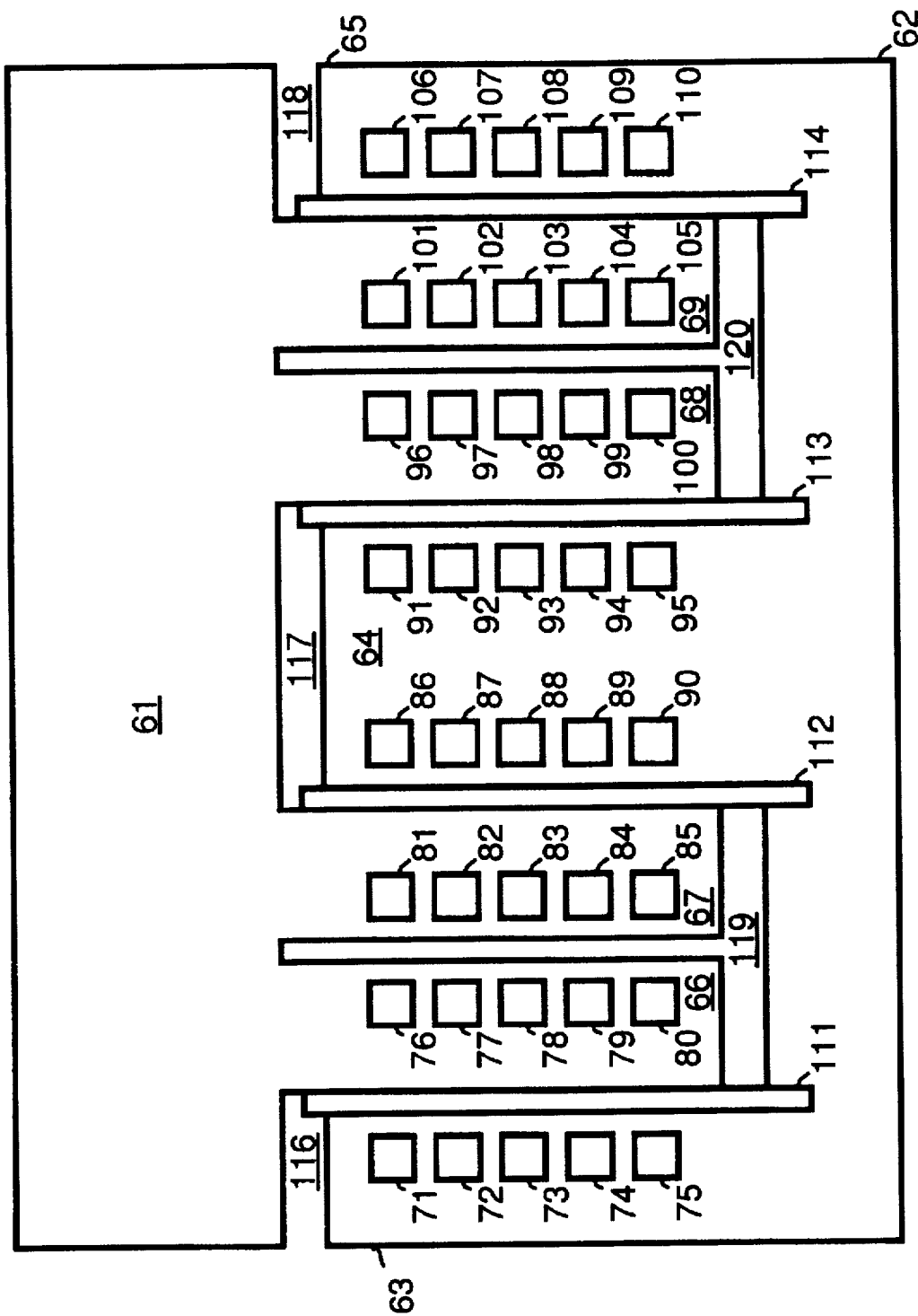
FIG. 2 is a top view of an asymmetric ladder structure ESD circuit in accordance with the preferred embodiment of the present invention.

FIG. 2 is a top view of an asymmetric ladder structure ESD circuit in accordance with the preferred embodiment of the present invention. An output pad 61 is electrically connected to a drain region 66, a drain region 67 a drain region 68 and a drain region 69. A source 62 includes a source region 63, a source region 64 and a source region 65. A gate region 111, a gate region 112, a gate region 113 and a gate region 114 separate source regions 63, 64 and 65 from drain regions 66, 67, 68 and 69. The circuit also includes an insulating region 116, an insulating region 117, an insulating region 118, an insulating region 119 and an insulating region 120. Source regions 63, 64 and 65 and drain regions 66, 67, 68 and 69 are connected to a metal layer through a contact 71, a contact 72, a contact 73, a contact 74, a contact 75, a contact 76, a contact 78, a contact 79, a contact 80, a contact 81, a contact 82, a contact 83, a contact 84, a contact 85, a contact 86, a contact 88, a contact 89, a contact 90, a contact 91, a contact 92, a contact 93, a contact 94, a contact 95, a contact 96, a contact 98, a contact 99, a contact 80, a contact 101, a contact 102, a contact 103, a contact 104, a contact 105, a contact 106, a contact 108, a contact 109 and a contact 110.

The ladder structure shown in FIG. 2 is constructed so that all of gate regions 111, 112, 113 and 114 turn on uniformly during ESD spikes. The ladder structure further results in a reduction of source resistance through source regions 63, 64 and 65. The ladder structure shown in FIG. 2 includes a separate drain structure. For example, as may be seen from FIG. 2, drain region 66 is separated from drain region 67 by a portion of insulating region 119. Likewise, drain region 68 is separated from drain region 69 by a portion of insulating region 120.

Additionally, the number of contacts in source region 64 is doubled to provide for a uniform and low source resistance. Also, as can be seen from FIG. 2, contacts within source regions 63, 64 and 65 are placed closer to gate regions 111, 112, 113 and 114 than are contacts in drain regions 66, 67, 68 and 69. For example, contacts 71–75 in source region 63 are closer to gate region 111 than are contacts 76 through 80 in drain region 66. Likewise, contacts 86–90 in source region 64 are closer to gate region 112 than are contacts 81 through 85 in drain region 67. And so on.

For example, source region 63 has a width of 2 microns, source region 64 has a width of 4 microns, source region 65 has a width of 2 microns, drain region 66 has a width of 4 microns, drain region 67 has a width of four microns, drain region 68 has a width of four microns, and drain region 69 has a width of 4 microns. Contacts 71 through 75 are approximately 0.6 microns from gate region 111. Contacts 76 through 80 are approximately 3 microns from gate region 111. Contacts 81 through 85 are approximately 3 microns from gate region 112. Contacts 86 through 90 are approximately 0.6 microns from gate region 112. Contacts 91 through 95 are approximately 0.6 microns from gate region 113. Contacts 96 through 100 are approximately 3 microns from gate region 113. Contacts 101 through 105 are approximately 3 microns from gate region 114. Contacts 106 through 110 are approximately 0.6 microns from gate region 114.

Figure 3:
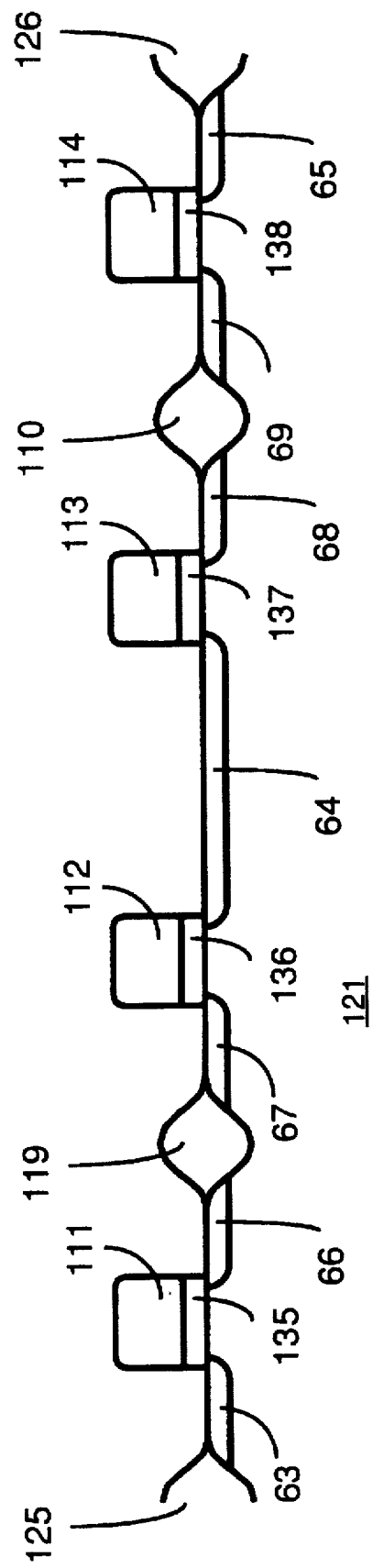
FIG. 3 shows a cross section of the asymmetric ladder structure ESD circuit shown in FIG. 2 in accordance with the preferred embodiment of the present invention.

FIG. 3 shows a cross section of the asymmetric ladder structure ESD circuit shown in FIG. 2 (but not in scale with FIG. 2). The structure shown in FIG. 3 is formed in a well 121 of a first conductivity type within a substrate. For example, the substrate may be of P-type material doped with $10^{15}$ atoms per cubic centimeter. Alternately, the substrate may be of N-type material. A typical depth of the substrate is 500 microns. Well 121 may be, for example, of P-type material doped with $10^{16}$ atoms per cubic centimeter.

A local oxidation of silicon (LOCOS) process or other process is used to form insulating layers 125, 119, 110 and 120 of, for example, field oxide on the substrate as shown. For example, in a LOCOS process, a layer of pad oxide is deposited. On top of the pad oxide, a layer of nitride is deposited. The nitride is patterned and etched. Field oxide is grown on the substrate at places where the nitride has been etched to expose the substrate. The nitride and pad oxide are then removed.

After the insulating layers are formed, a layer of gate oxide is placed (i.e. grown or deposited) on exposed portions of the substrate. Gate regions 111, 112, 113 and 114 are formed on the gate oxide layer using a mask and etch process. Gate regions 111, 112, 113 and 114 may be made of polysilicon, for example, doped with N-type atoms at $10^{20}$ atoms per cubic centimeter.

Gate regions 111, 112, 113 and 114 may be formed, for example, by chemical vapor deposition (CVD) of a polysilicon layer. The polysilicon is doped using $POCl_3$. Alternately, an implant of Phosphorus or Arsenic atoms may be used. If a polycide gate is desired, a metal layer is deposited on top of the polysilicon layer. A rapid thermal anneal (or other annealing process) is used to react the metal layer with the polysilicon layer. The metal-silicide layer may be formed, for example, using Titanium (Ti), Molybdenum (Mo), Chromium (Cr), Nickel (Ni), Platinum (Pt), Cobalt (Co), Tungsten (W) or Tantalum (Ta).

On top of the polysilicon (or polycide) layer there may be deposited a dielectric layer. The deposition of the dielectric layer is done, for example, using chemical vapor deposition (CVD) oxide. Alternately, deposition of the dielectric layer may be omitted. Using a mask, an etch is performed on both sides of each of gate regions 111, 112, 113 and 114. The etch exposes the gate oxide layer on top of the substrate.

On the sides of each of gate regions 111, 112, 113 and 114 are implanted regions of second conductivity type. Regions 63, 66, 67, 64, 68, 69 and 65 act as source/drain regions for the four transistors having gates regions 111, 112, 113, and 114. For example, an ion implant is used to dope regions 63, 66, 67, 64, 68, 69 and 65 with $n^+$-type atoms at $10^{20}$ atoms per cubic centimeter.

Alternately, when a lightly doped drain (LDD) process is utilized, $n^-$ regions may first be formed by doping with Phosphorus at $10^{17}$ atoms per cubic centimeter to a distance extending 0.15 micrometers below the surface of the substrate. A deposition and etch back may be used to form sidewall regions on opposite sides of the gate regions which serve as a spacers around the gate regions. The sidewall regions may be formed, for example by oxide deposition and etch back. Alternately, the sidewall regions may be formed by nitride deposition and etch back. For example, the sidewall regions are CVD oxide and each extends approximately 0.3 microns outward from gate regions. A dilute Hydrogen-Fluorine (HF) dip may be used to clear residual oxide over the source/drain regions. The regular $n^+$ and $p^+$ source-drain implant can then be performed on the circuit.

The exposed portions of the gate oxide layer are dipped off using, for example, a fifty to one mixture of $H_2O$ and HF. That leaves oxide regions 135, 136, 137 and 138. The result is shown in FIG. 3. Contact regions are formed, for example, by forming an insulating layer of a BPSG layer on top of a TEOS layer. For example, the TEOS layer is 0.15 microns and the BPSG layer is 0.4 microns. The insulating layer is masked and etched to produce connection holes. A metal layer is then deposited in contact with the source regions and the drain regions.

The foregoing discussion discloses and describes merely exemplary methods and embodiments of the present invention. As will be understood by those familiar with the art, the invention may be embodied in other specific forms without departing from the spirit or essential characteristics thereof. For example, in the embodiment described herein, a ladder structure with three source regions and four drain regions was described. This was illustrative. As will be readily understood by a person of ordinary skill in the art, the number of source regions and drain regions may be varied. For example, in an alternate structure, there may be four source regions and six drain regions. In another alternate structure, there may be two source regions and two drain regions. However, experimental results thus far have indicated that the shared source region structure shown in FIG. 2 has the best maximum sustaining current. Accordingly, the disclosure of the present invention is intended to be illustrative, but not limiting, of the scope of the invention, which is set forth in the following claims.

I claim:

1. A structure on an integrated circuit used for electrostatic discharge protection comprising:

an output pad for the integrated circuit;

a first source region;

a first drain region extending from the output pad, the first drain having a first side;

a first gate region separating the first source region from the first drain region;

a second drain region extending from the output pad, the second drain region having a second side;

a first insulating region separating the first drain region from the second drain region, the first insulating region being adjacent to the first side and to the second side, and the first insulating region extending from the output pad and running an entire length of the first side and an entire length of the second side so that entirely along the first side, the first drain region is separated from the second side of the second drain region by the first insulating region;

a second source region; and, a second gate region separating the second source region from the second drain region.

2. A structure as in claim 1 additionally comprising:

a third drain region extending from the output pad, the third drain region having a third side;

a third gate region separating the second source region from the third drain region;

a fourth drain region extending from the output pad, the fourth drain region having a fourth side;

a second insulating region separating the third drain region from the fourth drain region, the third insulating region being adjacent to the third side and to the fourth side, and the second insulating region extending from the output pad and running an entire length of the third side and an entire length of the fourth side so that entirely along the third side, the third drain region is separated from the fourth side of the fourth drain region by the second insulating region;

a third source region; and, a fourth gate region separating the third source region from the fourth drain region.

3. A structure as in claim 2 additionally comprising:

a first row of contacts in the first source region, the first row of contacts running parallel to the first gate region; and a second row of contacts in the first drain region, the second row of contacts running parallel to the first gate region;

wherein the first row of contacts is closer to the first gate region than the second row of contacts.

4. A structure as in claim 2 additionally comprising:

a first row of contacts in the first source region, the first row of contacts running parallel to the first gate region;

a second row of contacts in the first drain region, the second row of contacts running parallel to the first gate region;

a third row of contacts in the second drain region, the third row of contacts running parallel to the second gate region;

a fourth row of contacts in the second source region, the fourth row of contacts running parallel to the second gate region;

a fifth row of contacts in the second source region, the fifth row of contacts running parallel to the third gate region;

a sixth row of contacts in the third drain region, the sixth row of contacts running parallel to the third gate region;

a seventh row of contacts in the fourth drain region, the seventh row of contacts running parallel to the fourth gate region; and an eighth row of contacts in the third source region, the eighth row of contacts running parallel to the fourth gate region.

5. A structure as in claim 4 wherein:

the first row of contacts is closer to the first gate region than the second row of contacts;

the fourth row of contacts is closer to the second gate region than the third row of contacts;

the fifth row of contacts is closer to the third gate region than the sixth row of contacts; and, the eighth row of contacts is closer to the fourth gate region than the seventh row of contacts.

6. A structure as in claim 1 additionally comprising:

a first row of contacts in the first source region, the first row of contacts running parallel to the first gate region; and a second row of contacts in the first drain region, the second row of contacts running parallel to the first gate region;

wherein the first row of contacts is closer to the first gate region than the second row of contacts.

7. A structure as in claim 1 additionally comprising:

a first row of contacts in the first source region, the first row of contacts running parallel to the first gate region;

a second row of contacts in the first drain region, the second row of contacts running parallel to the first gate region;

a third row of contacts in the second drain region, the third row of contacts running parallel to the second gate region; and a fourth row of contacts in the second source region, the fourth row of contacts running parallel to the second gate region.

8. A structure as in claim 7 wherein:

the first row of contacts is closer to the first gate region than the second row of contacts; and, the fourth row of contacts is closer to the second gate region than the third row of contacts.

9. A structure on an integrated circuit used for electrostatic discharge protection comprising:

an output pad for the integrated circuit;

a first drain region;

a first source region extending from the output pad, the first source having a first side;

a first gate region separating the first drain region from the first source region;

a second source region extending from the output pad, the second source region having a second side;

a first insulating region separating the first source region from the second source region, the first insulating region being adjacent to the first side and to the second side, and the first insulating region extending from the output pad and running an entire length of the first side and an entire length of the second side so that entirely along the first side, the first source region is separated from the second side of the second source region by the first insulating region;

a second drain region; and, a second gate region separating the second drain region from the second source region.

10. A structure as in claim 9 additionally comprising:

a third source region extending from the output pad, the third source region having a third side;

a third gate region separating the second drain region from the third source region;

a fourth source region extending from the output pad, the fourth source region having a fourth side;

a second insulating region separating the third source region from the fourth source region, the third insulating region being adjacent to the third side and to the fourth side, and the second insulating region extending from the output pad and running an entire length of the third side and an entire length of the fourth side so that entirely along the third side, the third source region is separated from the fourth side of the fourth source region by the second insulating region;

a third drain region; and, a fourth gate region separating the third drain region from the fourth source region.

11. A structure as in claim 10 additionally comprising:

a first row of contacts in the first drain region, the first row of contacts running parallel to the first gate region; and a second row of contacts in the first source region, the second row of contacts running parallel to the first gate region;

wherein the first row of contacts is closer to the first gate region than the second row of contacts.

12. A structure as in claim 10 additionally comprising:

a first row of contacts in the first drain region, the first row of contacts running parallel to the first gate region;

a second row of contacts in the first source region, the second row of contacts running parallel to the first gate region;

a third row of contacts in the second source region, the third row of contacts running parallel to the second gate region;

a fourth row of contacts in the second drain region, the fourth row of contacts running parallel to the second gate region;

a fifth row of contacts in the second drain region, the fifth row of contacts running parallel to the third gate region;

a sixth row of contacts in the third source region, the sixth row of contacts running parallel to the third gate region;

a seventh row of contacts in the fourth source region, the seventh row of contacts running parallel to the fourth gate region; and an eighth row of contacts in the third drain region, the eighth row of contacts running parallel to the fourth gate region.

13. A structure as in claim 12 wherein:

the first row of contacts is closer to the first gate region than the second row of contacts;

the fourth row of contacts is closer to the second gate region than the third row of contacts;

the fifth row of contacts is closer to the third gate region than the sixth row of contacts; and, the eighth row of contacts is closer to the fourth gate region than the seventh row of contacts.

14. A structure as in claim 9 additionally comprising:

a first row of contacts in the first drain region, the first row of contacts running parallel to the first gate region; and a second row of contacts in the first source region, the second row of contacts running parallel to the first gate region;

wherein the first row of contacts is closer to the first gate region than the second row of contacts.

15. A structure as in claim 9 additionally comprising:

a first row of contacts in the first drain region, the first row of contacts running parallel to the first gate region;

a second row of contacts in the first source region, the second row of contacts running parallel to the first gate region;

a third row of contacts in the second source region, the third row of contacts running parallel to the second gate region; and a fourth row of contacts in the second drain region, the fourth row of contacts running parallel to the second gate region.

16. A structure as in claim 15 wherein:

the first row of contacts is closer to the first gate region than the second row of contacts; and, the fourth row of contacts is closer to the second gate region than the third row of contacts.

* * * * *